(12) United States Patent
Kang et al.

(10) Patent No.: US 7,730,386 B2
(45) Date of Patent: Jun. 1, 2010

(54) DIGITAL TELEVISION TRANSMITTER/RECEIVER AND METHOD OF PROCESSING DATA IN DIGITAL TELEVISION TRANSMITTER/RECEIVER

(75) Inventors: Kyung Won Kang, Seoul (KR); In Hwan Choi, Gyeonggi-do (KR); Kook Yeon Kwak, Gyeonggi-do (KR); Ja Hyuk Koo, Seoul (KR); Kyung Wook Shin, Gyeonggi-do (KR); Yong Hak Suh, Seoul (KR); Young Jin Hong, Seoul (KR); Sung Ryong Hong, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 945 days.

(21) Appl. No.: 11/514,124

(22) Filed: Aug. 30, 2006

(65) Prior Publication Data

US 2007/0136643 A1   Jun. 14, 2007

(30) Foreign Application Priority Data

Nov. 26, 2005   (KR) ...................... 10-2005-0113907

(51) Int. Cl.
    *H03M 13/03*   (2006.01)
(52) U.S. Cl. .................................................. 714/792
(58) Field of Classification Search ................ 714/755, 714/784, 786, 792; 375/240.12, 265, 340
    See application file for complete search history.

(56) References Cited

U.S. PATENT DOCUMENTS

| 7,111,221 B2 * | 9/2006 | Birru et al. ................... 714/755 |
| 2006/0088119 A1 * | 4/2006 | Fu et al. ...................... 375/265 |

FOREIGN PATENT DOCUMENTS

| CN | 1582580 | 2/2005 |
| KR | 10-2003-0026236 | 3/2003 |

OTHER PUBLICATIONS

Touzni et al., Ehanced 8-VSB transmission for North-American HDTV Terrestrial broadcast, 2003, IEEE, p. II-437-II-440.*
ATSC, "ATSC Standard: Digital Television Standard (A/53), Revision D, Including Amendment No. 1", ATSC Doc. A/53D, Jul. 19, 2005.

* cited by examiner

*Primary Examiner*—Shelly A Chase
(74) *Attorney, Agent, or Firm*—Lee, Hong, Degerman, Kang & Waimey

(57) ABSTRACT

The present invention relates to a digital television (DTV) transmitter/receiver. In the DTV transmitter, enhanced data is pre-processed by coding the enhanced data for forward error correction (FEC) and expanding the FEC-coded enhanced data. Enhanced data packets are generated including the pre-processed enhanced data and known data is inserted to at least one of the enhanced data packets. The enhanced data packets are multiplexed main data packets including main data. An RS encoder RS-codes the multiplexed main and enhanced data packets, the RS encoder adding systematic parity data to each main data packet and adding RS parity place holders to each enhanced data packet. The RS encoder may also insert non-systematic RS parity data or null data into the RS parity place holders included in each enhanced data packet.

20 Claims, 7 Drawing Sheets

DIGITAL TELEVISION TRANSMITTER/RECEIVER AND METHOD OF PROCESSING DATA IN DIGITAL TELEVISION TRANSMITTER/RECEIVER

This application claims the benefit of the Korean Patent Application No. 10-2005-0113907, filed on Nov. 26, 2005, which is hereby incorporated by reference as if fully set forth herein.

BACKGROUND OF THE INVENTION

1. Field of the Invention

The present invention relates to a digital communication system, and more particularly, to a system for a digital television (DTV) transmitter/receiver and a method of coding main and enhanced data in the DTV transmitter/receiver. Although the present invention is suitable for a wide scope of applications, it is particularly suitable for transmitting and receiving digital broadcasts by VSB (vestigial side band).

2. Discussion of the Related Art

Generally, the 8T-VSB transmission system adopted as a digital broadcasting standard by Korea and North America is a digital broadcast system developed for MPEG video/audio data transmission.

As the digital signal processing technology rapidly develops with the global use of Internet, the tendency for combining digital home appliances, computer and Internet together rises. So, in order to meet the user's various demands, many efforts need to be made to develop a system capable of transmitting various supplemental data with video/audio data.

A user of supplemental data broadcasting is expected to use the supplemental data broadcasting using a PC card or portable device having a simple type indoor antenna attached thereto.

Yet, signal intensity can be considerably decreased due to a shield effect of a wall and an influence of a near moving object within an indoor space and broadcast receiving performance can be reduced due to a ghost and noise generated from a reflective wave. Unlike a case of general video/audio data, a case of supplemental data transmission should have a lower error rate. In case of the video/audio data, an error failing to be detected by human eyes/ears does not matter. Yet, in case of supplemental data (e.g., a program execution file, stock information, etc.), a 1-bit error can cause a serious problem. So, the demand for developing a system more persistent against ghost and noise generated from a channel rises.

Additional data transmission will be performed by time-division through the same channel of MPEG video/audio in general. Since the beginning of digital broadcasting, ATSC VSB digital broadcast receivers receiving the MPEG video/audio only have globally spread in markets. So, the supplemental data transmitted on the same channel of the MPEG video/audio should avoid causing any effect to the conventional ATSC VSB dedicated receiver previously supplied to the markets. Such a situation is defined as ATSC VSB compatibility. And, a supplemental data broadcast system should be compatible with the ATSC VSB system. Besides, the supplemental data could be called enhanced data or E-VSB data.

However, in a poor channel environment, reception performance of the conventional ATSC VSB reception system may be reduced. Specifically, a portable or mobile receiver needs higher robustness against a channel change and noise.

SUMMARY OF THE INVENTION

Accordingly, the present invention is directed to a digital television (DTV) transmitter and a method of coding main and enhanced data in the DTV transmitter that substantially obviate one or more problems due to limitations and disadvantages of the related art.

An object of the present invention is to provide a digital television (DTV) transmitter and a method of coding main and enhanced data in the DTV transmitter, by which a new digital broadcast system suitable for supplemental data transmission and robust against noise can be provided.

Another object of the present invention is to provide a digital television (DTV) transmitter and a method of coding main and enhanced data in the DTV transmitter, by which reception performance can be enhanced by transmitting known data known by a transmitting/receiving side in a manner of inserting the known data in a prescribed area of a data section.

A further object of the present invention is to provide a digital television (DTV) transmitter and a method of coding main and enhanced data in the DTV transmitter, by which known data insertion is efficiently facilitated in a manner of performing non-systematic RS encoding on enhanced data including known data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter for coding main and enhanced data for transmission includes a pre-processor for pre-processing the enhanced data by coding the enhanced data for forward error correction (FEC) and expanding the FEC-coded enhanced data, a data formatter for generating enhanced data packets including the pre-processed enhanced data and for inserting known data to at least one of the enhanced data packets, a first multiplexer for multiplexing the enhanced data packets with main data packets including the main data, and an RS encoder for RS-coding the multiplexed main and enhanced data packets, the RS encoder adding systematic parity data to each main data packet and adding RS parity place holders to each enhanced data packet. Herein, the RS encoder may insert non-systematic RS parity data into the RS parity place holders included in each enhanced data packet. The RS encoder may also insert null data into the RS parity place holders included in each enhanced data packet.

The DTV transmitter may further include a data interleaver for interleaving the RS-coded main and enhanced data packets, a byte-symbol converter for converting the interleaved data packets into symbols, and a trellis encoder for trellis-encoding the converted symbols, the trellis encoder being initialized when the symbols outputted from the byte-symbol converter are symbols representing a beginning of a known data sequence. Herein the DTV transmitter may further include an initialization controller for generating initialization data symbols required to initialize one or more memories included in the trellis encoder, and a second multiplexer for outputting the initialization data symbols to the trellis encoder when the symbols outputted from the byte-symbol converter are the symbols representing the beginning of the known data sequence. Additionally, the DTV transmitter may further include a backward-compatibility processor for generating new parity symbols based on an output of the RS encoder and the initialization data symbols and providing the new parity symbols to the second multiplexer. Herein, the second multiplexer may output the new parity symbols to the trellis encoder when the symbols outputted from the byte-symbol converter are symbols representing the RS parity place holders. And the initialization controller may generate the initialization data symbols based on previous values of the memories such that current values of the memories are set to zero.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In the present invention, enhanced data can correspond to such data having information such as a program execution file, stock information and the like or may correspond to video/audio data. And, known data is the data previously known by agreement between transmitting and receiving sides. Moreover, main data is the data receivable by a conventional receiving system and includes video/audio data.

The present invention enhances reception performance of a receiver in a manner of multiplexing enhanced data and known data known by a transmitting/receiving side and transmitting the multiplexed data.

In particular, by performing non-systematic RS encoding on enhanced data including known data, the present invention enables a repetitive long known data sequence to be inserted and raises a degree of freedom for an insertion place.

Figure 1:
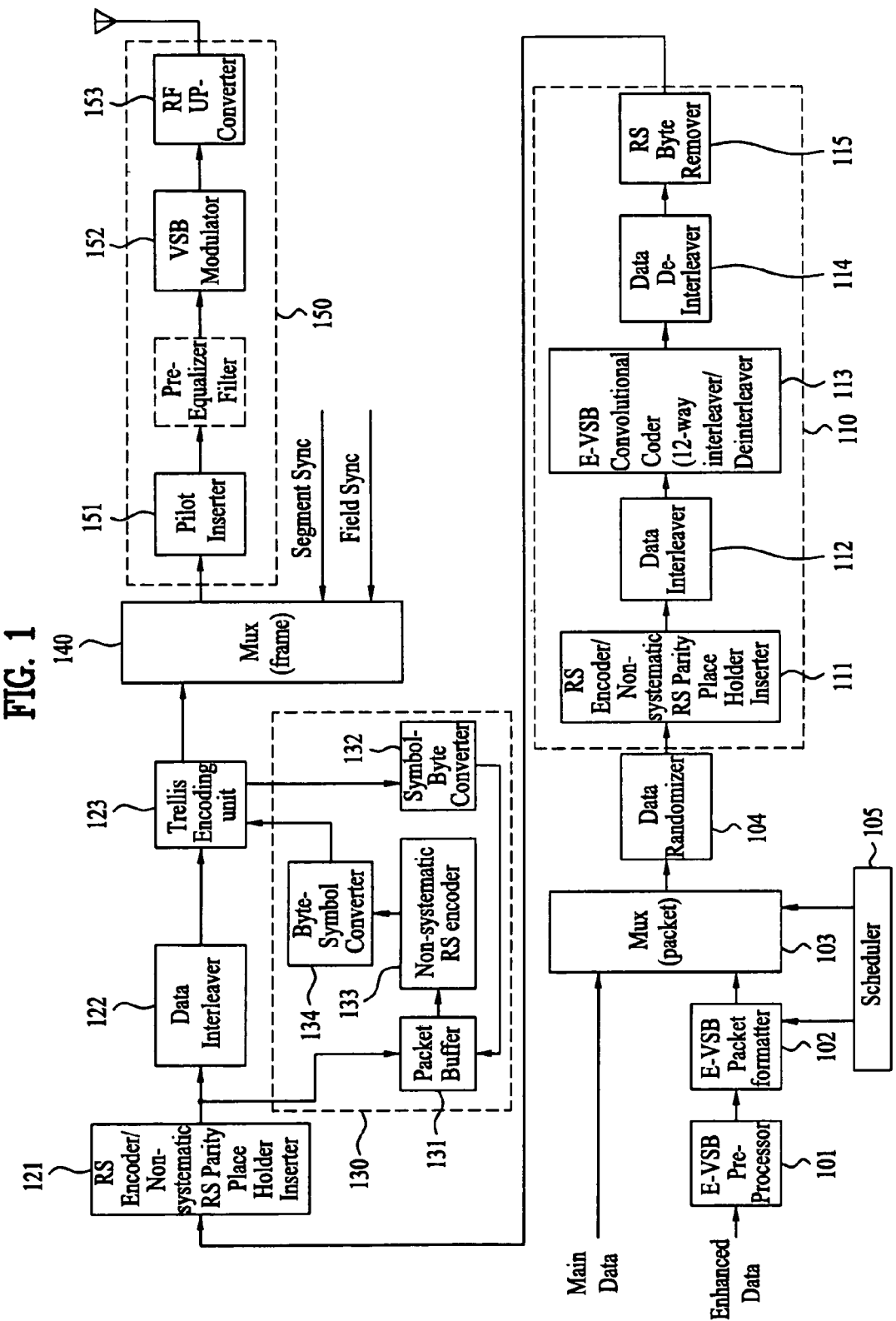
FIG. 1 is a block diagram of a digital broadcast transmitting system according to one embodiment of the present invention.

FIG. 1 is a block diagram of a digital broadcast transmitting system according to one embodiment of the present invention.

Referring to FIG. 1, a digital broadcast transmitting system according to one embodiment of the present invention includes an E-VSB pre-processor 101, an E-VSB packet formatter 102, a packet multiplexer 103, a data randomizer 104, a scheduler 105, an E-VSB post-processor 110, an RS (Reed-Solomon) encoder & non-systematic RS parity holder inserter 121, a data interleaver 122, a trellis encoding unit 123, a backward-compatibility processor 130, a frame multiplexer 140 and a transmitter 150.

In the above-configured transmitting system, main data is outputted to the packet multiplexer 103 by transport packet unit, whereas enhanced data is outputted to the E-VSB pre-processor 101.

The E-VSB pre-processor 101 performs pre-processing such as additional error correction encoding, interleaving, null data insertion and the like on the enhanced data and then outputs the pre-processed data to the E-VSB packet formatter 102.

The E-VSB packet formatter 102 configures a group by multiplexing the pre-processed enhanced data and previously defined known data or a known data place holder together under the control of the scheduler 105. The E-VSB packet formatter 102 divides data within the group into 184-byte enhanced data packets, attaches a 4-byte MPEG header to a front of each of the packets and then outputs a 188-byte enhanced data packet (i.e., MPEG compatible packet). In particular, one enhanced data packet group includes a plurality of consecutive enhanced data packets. An insertion place of the known data will be explained in detail later.

An output of the E-VSB packet formatter 102 is inputted to the packet multiplexer 103. The packet multiplexer 103 performs time division multiplexing on the 188-byte main data packet and the 188-byte enhanced data packet by transport stream (TS) packet unit to output under the control of the scheduler 105.

In particular, the scheduler 105 generates a control signal enabling the packet multiplexer 103 to multiplex the main and enhanced data packets together and then outputs the control signal to the packet multiplexer 103. If so, the packet multiplexer 103 having received the control signal multiplexes the main data packet and the enhanced data packet into the TS packet unit to output.

An output of the packet multiplexer 103 is inputted to the data randomizer 104. The data randomizer 104 removes MPEG sync byte from an input packet, randomizes the rest 187 bytes using an internally generated pseudo-random byte and then outputs the randomized packet to the E-VSB post-processor 110.

The E-VSB post processor 110 includes an RS encoder & non-systematic parity place holder inserter 111, a data interleaver 112, an E-VSB convolutional coder 113, a data interleaver 114 and an RS byte remover 115.

The RS encoder & non-systematic parity place holder inserter 111 of the E-VSB post-processor 110 performs systematic RS encoding or non-systematic parity place holder insertion on the randomized data.

In particular, if a 187-byte packet outputted from the data randomizer 104 is a main data packet, the RS encoder & non-systematic parity place holder inserter 111 attaches a 20-byte parity byte to a rear of the 187-byte data by performing systematic RS encoding like the conventional ATSC VSB system and then outputs the attached data to the data interleaver 112.

Meanwhile, if a 187-byte packet outputted from the data randomizer 104 is an enhanced data packet, the RS encoder & non-systematic parity place holder inserter 111 determines a 20-parity byte place within the packet, inserts a null byte in the determined parity byte place, sequentially inserts bytes of the enhanced data packet in the rest of 187 byte places and then outputs them to the data interleaver 112.

The data interleaver 112 performs data interleaving on an output of the RS encoder & non-systematic parity place holder inserter 111 and then outputs it to the E-VSB convolutional coder 113. A data interleaving operation of the data interleaver 112 will be explained in detail later.

The E-VSB convolutional coder 113 performs convolutional coding on an output of the data interleaver 112 and then outputs it to the data deinterleaver 114.

The data deinterleaver 114 performs data deinterleaving on input data by a reverse process of the data interleaver 112 and then outputs the deinterleaved data to the RS byte remover 115.

The RS byte remover 115 removes the 20-byte parity attached by the RS encoder & non-systematic parity place holder inserter 111. In this case, if the inputted data is the main data packet, the RS byte remover removes last 20 bytes from 207 bytes. If the inputted data is the enhanced data packet, the RS byte remover 115 removes 20-byte RS parity place holders from 207 bytes. This is to re-calculate parities since original data is modified by the E-VSB convolutional coder 113 in case of the enhanced data.

The E-VSB convolutional coder 113 converts inputted bytes to symbols, performs convolutional coding on an enhanced data symbol only, converts the coded result to bytes, and then outputs the converted bytes. In particular, the E-VSB convolutional coder 113 outputs data without modification if an output of the data interleaver 112 is the main data, the MPEG header byte attached by the E-VSB packet formatter 102 or the RS parity byte or parity place holder byte attached to the enhanced data packet by the RS encoder & non-systematic RS parity place holder inserter 111.

Meanwhile, the known data can be inserted in the enhanced data packet by the E-VSB packet formatter 102. Alternatively, the E-VSB packet formatter 102 inserts a place holder of the known data and the E-VSB convolutional coder 113 inserts the known data in the corresponding place instead of the place holder. And, the E-VSB convolutional coder 113 outputs the known data symbol without additional coding like the main data.

An output of the RS byte remover 115 is inputted to the RS encoder & non-systematic RS parity place holder inserter 121.

Like the former RS encoder & non-systematic RS parity place holder inserter 111, if a 187-byte packet outputted from the RS byte remover 115 is a main data packet, the RS encoder & non-systematic RS parity place holder inserter 121 attaches 20-byte parity bytes to a rear of 187-byte data by performing systematic RS encoding in the same manner of the conventional ATSC VSB system. In case of an enhanced data packet, a 20-parity byte place is determined and it is able to insert RS parity obtained by performing non-systematic RS encoding in the determined parity byte place or to insert null byte therein instead of the RS parity. And, bytes within the enhanced data packet are sequentially inserted in the rest 187 byte places among 207 byte places. The null byte can be set to an arbitrary value and is replaced by a parity value calculated by the non-systematic RS encoder 133 of the backward-compatibility processor 130. Hence, the null byte plays a role in holding a place of the parity byte of a non-systematic RS code.

An output of the RS encoder and non-systematic RS parity place holder inserter 121 is outputted to the data interleaver 122 and also inputted to a backward-compatibility processor 130 to re-calculate parity in case of the enhanced data packet.

Besides, the data interleaver 122 performs interleaving on input data according to the same interleaving rule of the former data interleaver 112.

Figure 2:
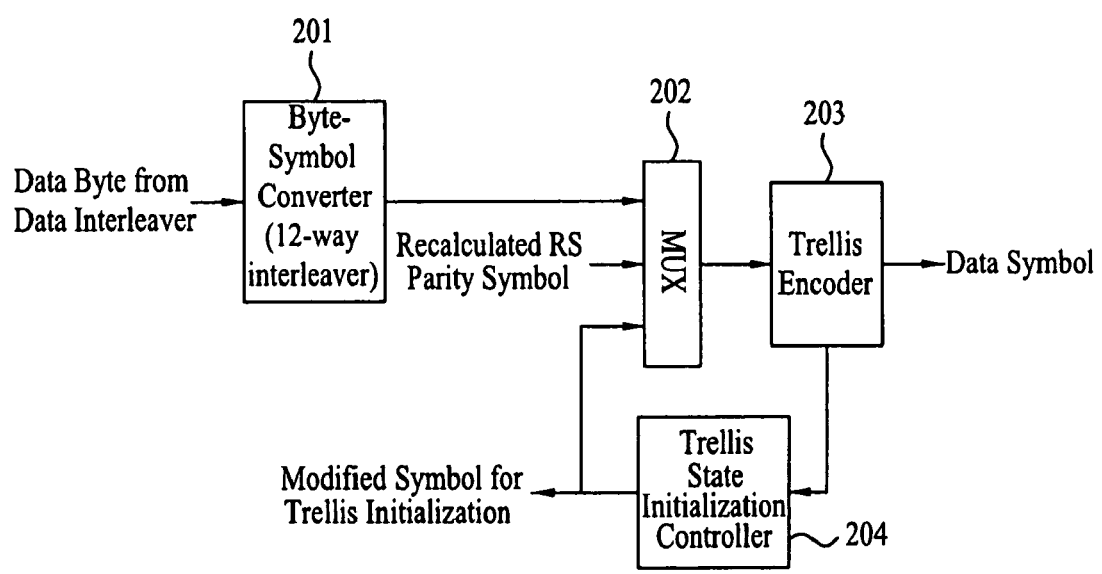
FIG. 2 is a block diagram of a trellis encoding unit of the digital broadcast transmitting system shown in FIG. 1.
Figure 3:
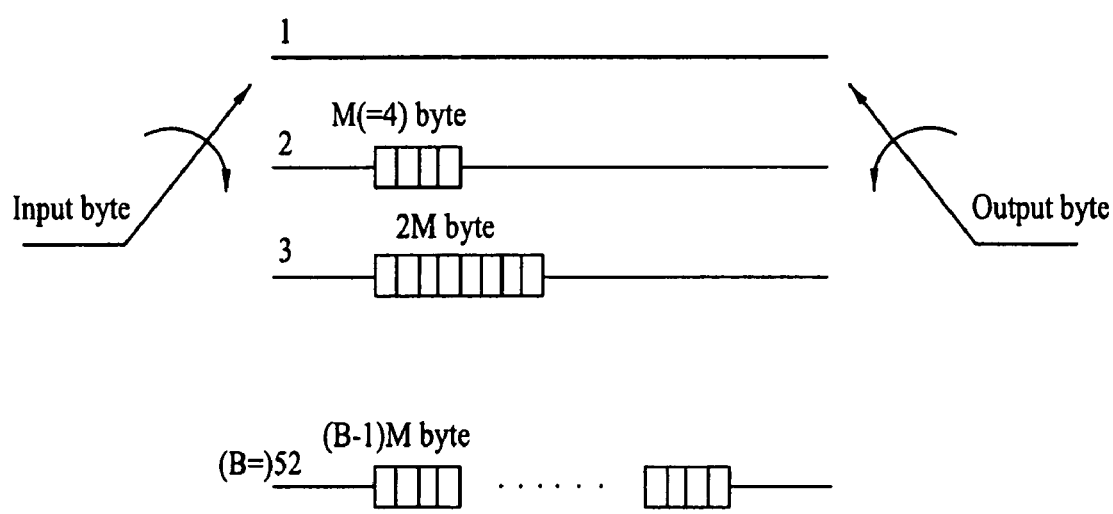
FIG. 3 is a diagram of a data interleaver shown in FIG. 2.

FIG. 3 is a diagram of the data interleaver (122 or 112) shown in FIG. 2, in which a convolutional interleaver is exemplarily shown. In this case, the number of branches is 52 and the number (M) of unit memory bytes is 4 (M=4).

Referring to FIG. 3, in the data interleaver, if a first byte is inputted, it is directly outputted via a first branch. A second byte is inputted via a second branch, by which a value prior to 52*4 byte is outputted.

Figure 4:
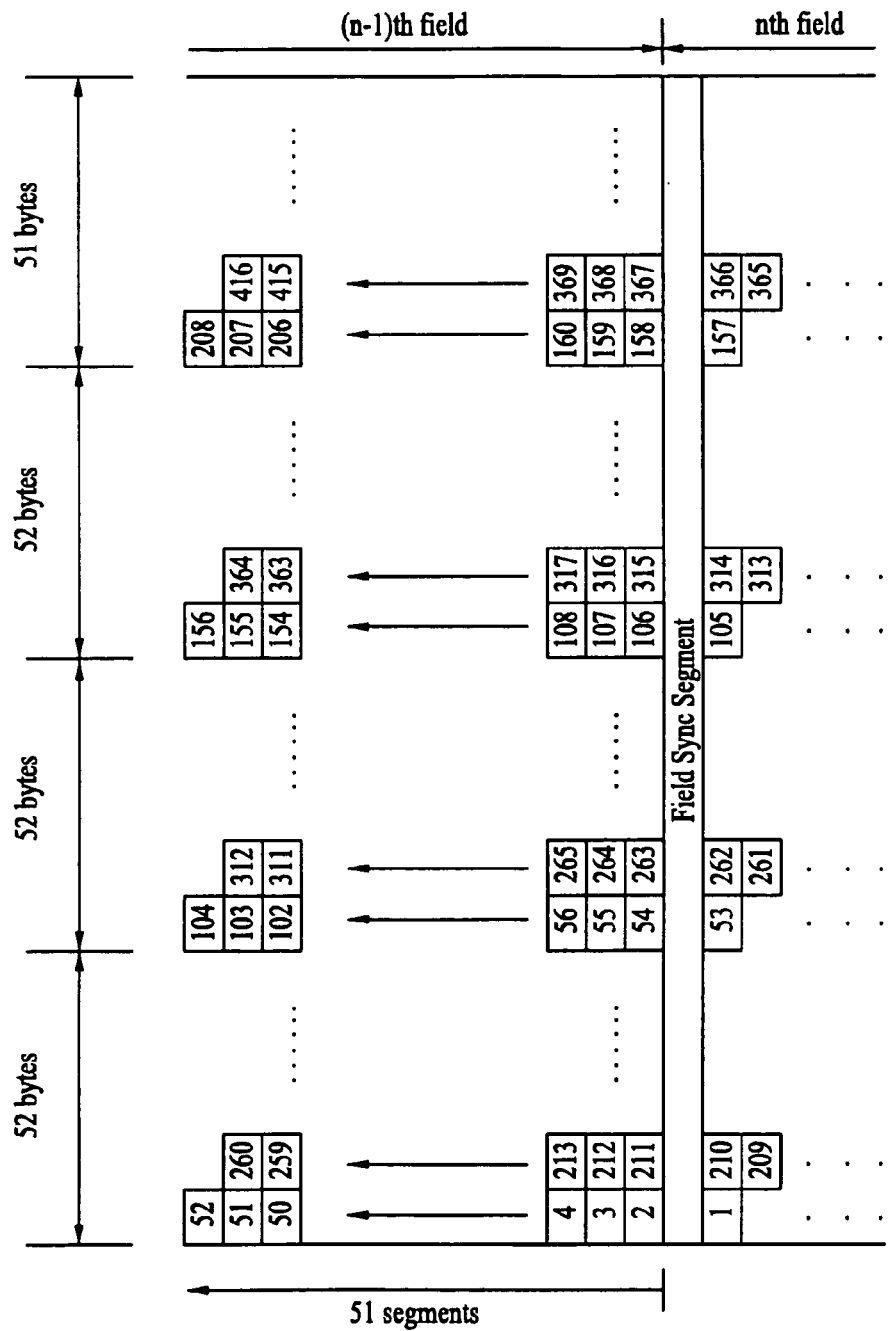
FIG. 4 is a diagram for explaining an output sequence of a data interleaver on a VSB frame.

FIG. 4 is a diagram for explaining input and output sequences of a data interleaver on a VSB frame.

Referring to FIG. 4, data inputs are sequentially inputted by segment unit from top to bottom. And, bytes within a segment are sequentially inputted left to right. Numerals in the drawing indicate output sequences of a data interleaver. In this case, the data interleaver operates by 52-segment unit.

An output of the data interleaver 122 is inputted to the trellis encoding unit 123. And, the trellis encoding unit 123 encodes a 2-bit input into three bits to output.

An output of the trellis encoding unit 123 is inputted to the frame multiplexer 140.

The frame multiplexer 140 inserts a field sync and a segment sync in the output of the trellis encoding unit 123 and then outputs a corresponding signal to the transmitter 150.

The transmitter 150 includes a pilot inserter 151, a VSB modulator 152 and a radio frequency (RF) converter 153. And, the transmitter 150 plays the same role of the conventional VSB transmitter.

To make the output data of the trellis encoding unit 123 into known data defined by a transmitting/receiving side, initialization of a memory within the trellis encoding unit 123 is needed for the known data inserted in the enhanced data packet.

For the initialization, an input of the trellis encoder needs to be modified. And, RS parity affected by the correspondingly modified data is re-calculated to be substituted for original parity data. This process is performed by the backward-compatibility processor 130.

FIG. 2 is a detailed diagram of the trellis encoding unit 123 that can be initialized.

Referring to FIG. 2, a trellis encoding unit according to one embodiment of the present invention includes a byte-to-symbol converter 201, a multiplexer 202 selecting a trellis encoder input, a trellis encoder 203 and an initialization controller 204 initializing the trellis encoder.

The byte-to-symbol converter 201 of the trellis encoder unit receives data-interleaved data by byte unit, converts the received data to symbol unit, performs 12-way interleaving, and then outputs the interleaved data to the multiplexer 202.

In general, an output of the byte-to-symbol converter 201 is selected by the multiplexer 202 and is then directly outputted to the trellis encoder 203. Yet, if the interleaved data is known data and if the known data corresponds to a beginning part of a known data sequence consecutively inputted, initialization of the trellis encoder 203 is necessary. The trellis encoder 203 includes a memory device and a current output is affected by a current and previous inputs. So, in order to output a known data pattern after trellis encoding, a process for initializing the memory device within the trellis encoder 203 to a predetermined value is needed.

In case that the initialization of the memory device of the trellis encoder 203 is needed, a portion of the known data is replaced by initialization data to be outputted to the trellis encoder 203. If so, the memory device within the trellis encoder 203 is initialized to a predetermined value by the initialization data. An output of the trellis encoder 203 after the initialization can becomes the known data encoded into a pattern promised by the transmitting/receiving side.

The initialization controller 204 initializing the trellis encoder 203 receives a value of the memory device within the trellis encoder 203, generates initialization data to be inputted to the trellis encoder 203, and then outputs the generated data to the multiplexer 202 and the backward-compatibility processor 130.

In particular, the trellis encoder 203 encodes an upper bit of two bits configuring one symbol into 1 bit using one memory device and then outputs the 1 bit. And, the trellis encoder 203 encodes a lower bit of the two bits into 2 bits using two memory devices and then outputs the 2 bits. In this case, if input data is the known data and if the known data corresponds to a beginning part of a consecutively inputted known data sequence, the memory devices need to be initialized to output specific known data after trellis encoding.

So, if the initialization of the memory device within the trellis encoder 203 is needed, the initialization controller 204 generates initialization data according to a current state and specific initialization state of the memory device and then outputs the generated initialization data to the multiplexer 202.

The initialization data consists of 4 bits, i.e., two symbols. In this case, the trellis encoder 203 includes twelve encoders. And, twelve bytes outputted from the multiplexer 202 are sequentially inputted to the twelve encoders, respectively. In this case, initial four bits, i.e., two symbols of each byte can become the initialization data. In particular, the initialization controller 204 generates initialization data for initializing the memory device of the trellis encoder 203 in the two symbol sections from which a known data sequence starts and then outputs the generated initialization data to the multiplexer 202 and the backward-compatibility processor 130.

The backward-compatibility processor 130 receives the output of the RS encoder & non-systematic parity place holder inserter 121 and the output of the initialization controller 204 of the trellis encoding unit 123, generates non-systematic 20-byte parity and then outputs the generated parity to the multiplexer 202 of the trellis encoding unit 123.

In particular, since the initialization for the memory device of the trellis encoding unit 123 is achieved by new data instead of being achieved by the data interleaved by the data interleaver 122, the RS parity is re-generated to be substituted for original parity data. And, this is performed by the backward-compatibility processor 130.

The backward-compatibility processor 130 includes a packet buffer 131, a symbol-to-byte converter 132, a non-systematic RS encoder 133 and a byte-to-symbol converter 134.

The output of the RS encoder & non-systematic RS parity place holder inserter 121 is inputted to the data interleaver 122 and the packet buffer 131 of the backward-compatibility processor 130. And, the initialization data of the initialization controller 204 of the trellis encoding unit 123 is inputted to the multiplexer 202 of the trellis encoding unit 123 and the symbol-to-byte converter 132 of the backward-compatibility processor 130.

In this case, since the input and output of the RS encoder and non-systematic RS parity place holder inserter 121 follow byte units, the symbol-to-byte converter 132 converts the symbol unit of the initialization data to the byte unit and then outputs the converted data to the packet buffer 131.

The packet buffer 131 receives a byte output of the RS encoder and non-systematic RS parity place holder inserter 121 and a byte output of the symbol-to-byte converter 132, temporarily stores the received outputs and then outputs the stored outputs to the non-systematic RS encoder 133.

The non-systematic RS encoder 133 receives a byte output of the packet buffer 131, generates 20-byte parity and then outputs the generated parity to the multiplexer 202 of the trellis encoder 13 via the byte-to-symbol converter 134 for the unit conversion to the symbol unit.

If the inputted data, which was interleaved and converted to the symbol, corresponds to the beginning part of the known data sequence, the multiplexer 202 selects to output an initialization symbol of the initialization controller 204 instead of the inputted symbol. If the inputted data is a parity place holder, the multiplexer 202 selects an output symbol of the symbol-to-byte converter 134 of the backward-compatibility processor 130 instead of the inputted symbol. In other cases, the multiplexer 202 selects the inputted data from the byte-symbol converter 201, which was interleaved and converted to the symbol, and then outputs the selected data to the trellis encoder 203.

In particular, symbols at the first two places of the known data sequence are substituted by the initialization symbols to be inputted to the trellis encoder 203. A symbol at a parity place within each packet is substituted by the parity symbol re-calculated by the backward-compatibility processor 130 to be inputted to the trellis encoder 203. In case that the RS encoder & non-systematic RS parity place holder inserter 121 inserts a null byte for the enhanced data packet instead of inserting a non-systematic RS parity, a non-systematic RS parity of the enhanced data packet is calculated by the backward-compatibility processor 130 regardless of the initialization of the trellis encoder and is then inputted to the trellis encoder 203.

The trellis encoder 203 performs trellis encoding on the data outputted from the multiplexer 202 and then outputs the encoded data to the frame multiplexer 140. And, the trellis encoder 203 outputs a state of the memory device within the trellis encoder to the initialization controller 204.

Known Data Insertion and Non-systematic RS Parity Place

Known data insertion and non-systematic RS parity place Setting according to the present invention are explained in detail as follows.

First of all, if an inputted 187-byte packet is a main data packet, the RS encoder & non-systematic RS parity place holder inserter generates 20-byte parity by performing systematic RS encoding like the ATSC VSB system and then attaches the generated 20-byte parity to a rear of the 187-byte.

In case of an enhanced data packet, 187 bytes among 207 bytes to be outputted correspond to the inputted data and 20 bytes become a parity byte. This is the same case of the systematic RS encoding. Yet, a place of the 20-byte parity may differ within 207 bytes for each enhanced data packet and a parity value is found by non-systematic RS encoding.

Once the parity place is determined, data is placed at 187 bytes where the parity is not located.

Non-systematic parities inserted by the RS encoder & non-systematic RS parity place holder inserter may become practical parties or just correspond to a meaningless byte for holding the parity place. In case that the non-systematic RS parities are inserted as the meaningless byte, the backward-compatibility processor calculates the parity value for substitution.

The RS parity is re-calculated by the backward-compatibility processor for the enhanced data packet including the trellis initialization data.

For an enhanced data packet that includes a known data to be replaced by the trellis initialization data, it is required to re-calculate the RS parity data for the enhanced data packet since the replacement by the initialization data is performed in the trellis encoding unit 123 which is behind the RS encoder or non-systematic RS parity place holder inserter 121.

If a place of a parity existing within one packet comes behind the data to be substituted by initialization at an input of the trellis encoder, it is able to calculate a new parity by RS encoding by using the substituted data. In this case, if systematic RS encoding is performed on the enhanced data packet including the initialization data, it is unable to insert known data in a parity area since the RS parity place is already determined. And, a place of data coming ahead of the parity is very limited. So, an area available for trellis initialization is correspondingly limited.

Yet, if the non-systematic RS encoding is performed on the enhanced data packet including the initialization data, the parity place is movable and the known data can be inserted in the parity area of the systematic RS encoding. And, it is also advantageous that the limitation of the data place for the trellis initialization is almost eliminated as compared with the case of using the systematic RS encoder.

If one packet is inputted to the data interleaver shown in FIG. 3, it is interleaved and outputted by byte unit. The interleaving does re-ordering of data sequence.

FIG. 4 is a diagram for explaining input/output order of a data interleaver on a VS frame.

Referring to FIG. 4, data within a packet is inputted to the data interleaver by byte unit. In this case, the data is inputted top to bottom according to a segment sequence. And, the data in inputted from a left first byte to a right $207^{th}$ byte in order within a segment.

Thus, if the data is inputted and if an $n^{th}$ field starts in FIG. 4, a data interleaver input is carried out in a sequence of byte #1, byte #210 and the like. And, a data interleaver output is carried out in a sequence of byte #1, byte #2, byte #3 and the like. Hence, the sequence of the inputted bytes and the sequence of the outputted bytes are different from each other by interleaving.

In particular, since the data interleaver has the configuration of the convolutional interleaver having the branch (B) of 52, the sequence, as shown in FIG. 4, goes round by a 52-byte cycle in outputting one segment. Hence, byte #210 byte #262 and the like are outputted after byte #1, byte #53, byte #105 and byte #157 have been outputted.

So, if the systematic RS encoding is to be performed, parity should exist at last 20 bytes of each segment. And, parities can be outputted according to the interleaved output sequence ahead of the initialization bytes for the trellis initialization for the known data generation.

If so, RS encoding should be performed ahead of information indicating how data should be substituted for the initialization. Yet, this is impossible. So, error takes place in RS decoding.

In aspect of one segment unit for the data interleaver output, each segment can be configured in a manner that substitution data for initialization is located at a place of data outputted ahead of all systematic RS parity bytes. Yet, places of initialization bytes are restricted to limited area, and thus this puts limitation on an area in which known data can be inserted.

Yet, as mentioned in the foregoing description, in aspect of a place of RS parity within one segment and in aspect of an output of the data interleaver, the restriction, which occurs in case of using the systematic RS encoding only, for the known data insertion place can be eliminated only if parity is calculated by enabling the RS parity to be outputted behind the initialization bytes and by performing the non-systematic RS encoding. And, compatibility with the conventional VSB receiver incapable of supporting E-VSB can be maintained as well.

FIG. 5 is diagram of data configurations before and after a data interleaver according to known data insertion of the present invention.

Figure 5A:
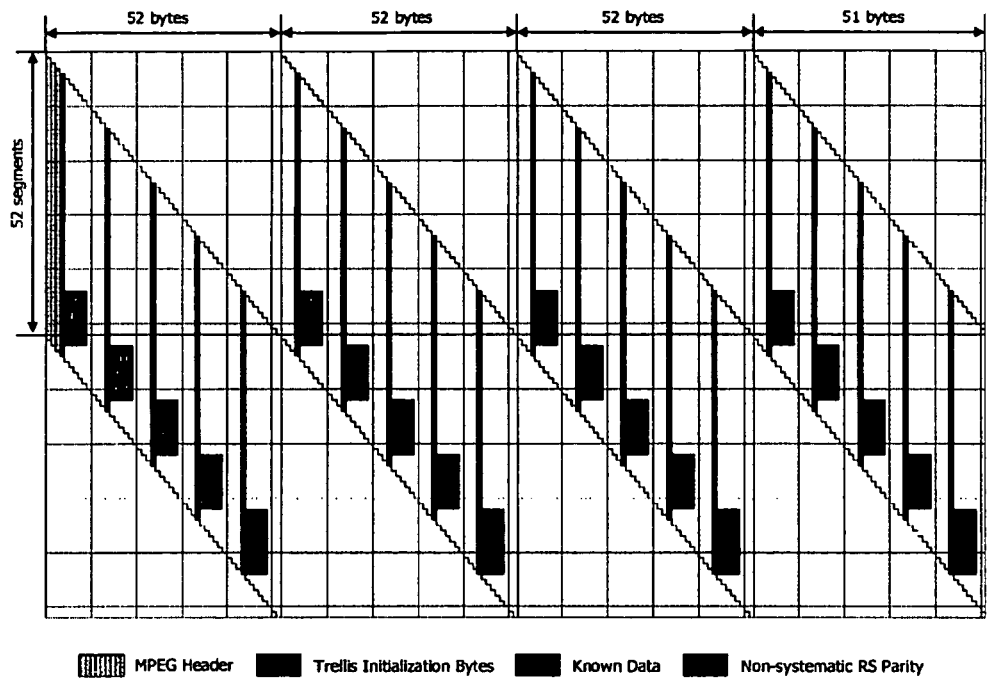
FIG. 5 is diagram of data configurations before and after a data interleaver according to known data insertion of the present invention.

In FIG. 5A, a data configuration at an input end of a data interleaver is shown. And, a configuration at an output end of the data interleaver corresponding to the input configuration of FIG. 5A is shown in FIG. 5B.

First of all, a receiver receives data in an order of a data interleaver output end. To receive consecutive known data, known data should be consecutively inserted like the numbering sequence of FIG. 4.

Figure 5B:
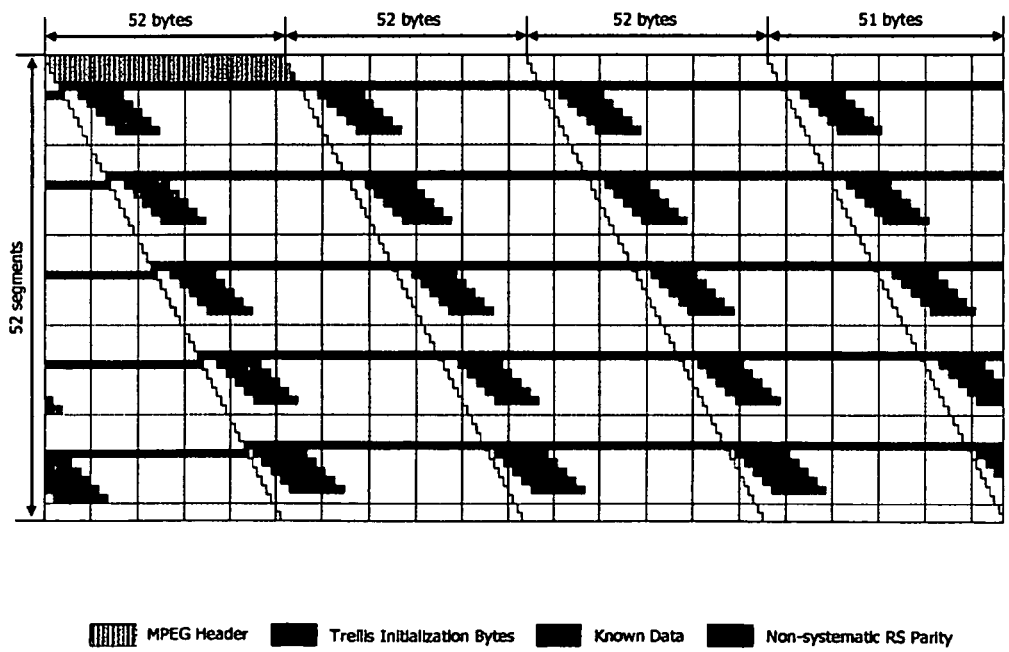

In order to make one segment received by the receiver into the known data like the example shown in FIG. 5B, one segment is divided into 52 bytes unit and the known data should be inserted in the same byte position by 52-byte unit like the example shown in FIG. 5A. In this case, an initialization byte needs to be placed at a beginning part of a known data sequence. Hence, once a place of the known data within the segment is determined, a place, where normal data ends and the known data begins in aspect of a data interleaver output end, is determined as the place of the initialization byte.

Once the places of the known data and the initialization byte are determined, it is able to determine a place of a non-systematic RS parity byte. In this case, parity bytes are placed to be outputted behind the initialization bytes in aspect of the data interleaver output. In particular, in aspect of one segment, since a sequence having a small numbering in FIG. 4 is firstly outputted from the data interleaver, the RS parity is placed to a number later than the numbering sequences of the initialization bytes.

Figure 6:
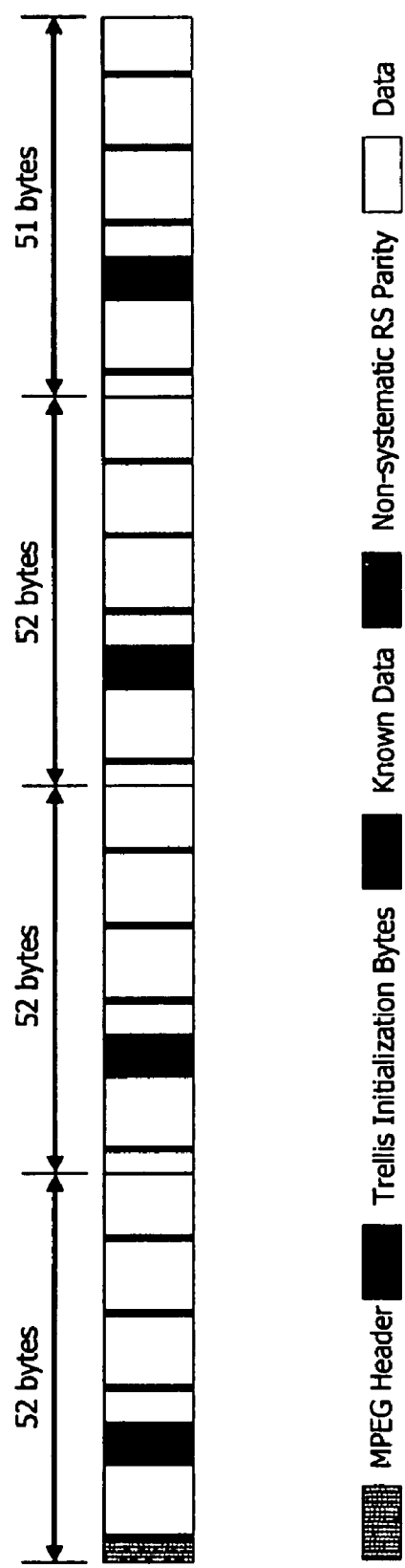
FIG. 6 is a diagram of a data configuration by segment unit.

FIG. 6 shows an example that known data, initialization bytes and non-systematic RS parity bytes are placed within one segment.

Referring to FIG. 6, one segment consists of 207 bytes. First three bytes are fixed as MPEG header bytes and the rest 204 bytes are configured with data. 20 bytes among the 204 bytes are RS parity bytes and the rest 184 bytes consist of pure data bytes and known data bytes. The known data bytes can be divided into bytes for initialization and pure known data bytes. In FIG. 6, in aspect of a data interleaver output, one segment is divided by 52-byte unit to output known data consecutively and the known data is placed at the same place for each 52-byte group. If a place of the known data is determined and if an initialization byte exists at a specific place within a segment, non-systematic RS parity is placed behind the initialization byte in aspect of a data interleaver output.

For example of inserting the known data, in aspect of a data interleaver output configuration shown in FIG. 5B, if known data is inserted behind MPEG header in a first segment to reach the end of the segment, the MPEG header bytes in the second segment can be used a continuation of the known data because the MPEG header bytes for an enhanced data packet have a pre-determined value between a transmitter and a receiver.

Thus, the enhanced data packet according to the present invention can be configured to include the enhanced data carrying information and the known data inserted for reception performance enhancement.

In this case, the known data is unable to be located at a place of a 3-byte MPEG header in aspect of one segment unit, needs initialization byte at a beginning part of the known data, and RS parity bytes are placed to be outputted behind the initialization byte at an output of the data interleaver. So, this is taken into consideration to enable the E-VSB packet formatter 102 to determine the corresponding known data place.

Once the place of the known data is determined, a place of the initialization is correspondingly determined. And, an enhanced data packet is configured to place an RS parity behind the initialization byte place.

For instance, if one segment is divided into four groups by 52-byte unit (last fourth group includes 51 bytes), the known data can be placed at any place of each of the groups except places of last five bytes of each group.

Figure 7:
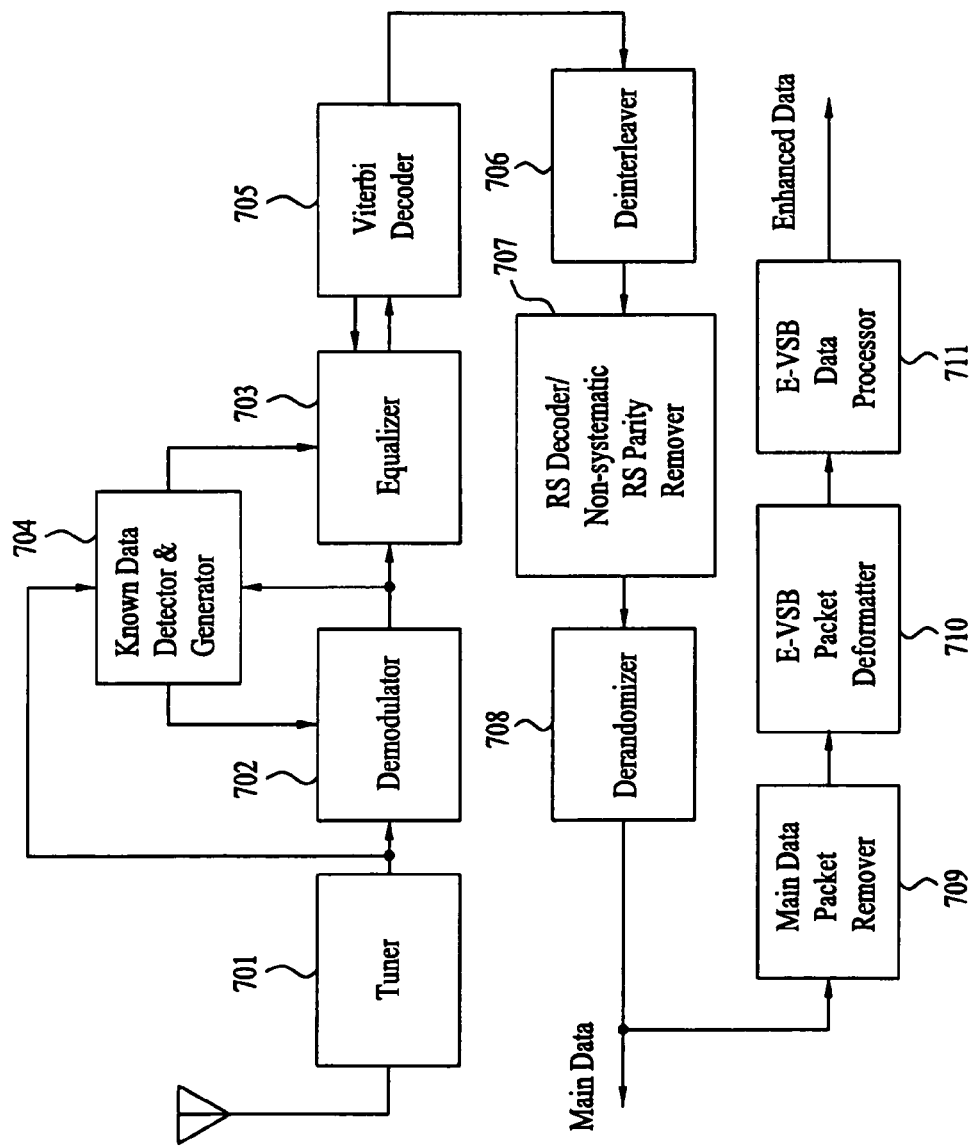
FIG. 7 is a block diagram of a digital broadcast receiving system according to one embodiment of the present invention.

FIG. 7 is a block diagram of a digital broadcast receiving system according to one embodiment of the present invention. In particular, the digital broadcast receiving system receives data transmitted from the digital broadcast transmitting system shown in FIG. 1 and then recovers the received data into original data by demodulation and equalization.

Referring to FIG. 7, a digital broadcast receiving system according to one embodiment of the present invention includes a tuner 701, a demodulator 702, a known data detector & generator 704, a Viterbi decoder 705, a data deinterleaver 706, an RS decoder & non-systematic RS parity remover 707 and a derandomizer 708.

And, the digital broadcast receiving system includes a main data packet remover 709, an E-VSB packet deformatter 710 and an E-VSB data processor 711.

The tuner 701 tunes to down-convert a frequency of a specific channel and then outputs it to the demodulator 702 and the known data detector & generator 704.

The demodulator 702 performs carrier recovery and timing recovery on the tuned channel frequency so that converts the input signal to a baseband signal and then outputs the baseband signal to the equalizer 703 and the known data detector & generator 704.

The equalizer 703 compensates distortion on channel included in the demodulated signal and then outputs the compensated signal to the Viterbi decoder 705.

In this case, the known data detector & generator 704 detects a known data symbol sequence inserted by a transmitting side from input/output data of the demodulator 702, i.e., data before or after the demodulation and then outputs a generated symbol sequence of the known data to the demodulator 702 and the equalizer 703.

The demodulator 702 is able to enhance demodulation performance using the known data symbol sequence in timing or carrier recovery. Likewise, the equalizer 703 is able to enhance equalization performance using the known data.

The Viterbi decoder 705 converts main data symbol and enhanced data symbol outputted from the equalizer 703 to bytes by Viterbi decoding and then outputs the converted bytes to the deinterleaver 706.

The deinterleaver 706 performs a reverse process of the data interleaver of the transmitting side and then outputs a corresponding signal to the RS decoder & non-systematic RS parity remover 707.

The RS decoder and non-systematic RS parity remover 707 performs systematic RS decoding in case that the received packet is a main data packet. If the received packet is an enhanced data packet, the RS decoder & non-systematic RS parity remover 707 removes non-systematic RS parity byte from the packet and then outputs it to the derandomizer 708.

The derandomizer 708 performs a reverse process of a randomizer on an output of the RS decoder and non-systematic RS parity remover 707, inserts MPEG sync byte in a front of each packet and then outputs it by 188-byte packet unit.

An output of the derandomizer 708 is outputted to both a main MPEG decoder (not shown in the drawing) and the main data packet remover 709.

The main MPEG decoder performs decoding on a packet corresponding to main MPEG only. This is because the enhanced data packet, which has null-packet PID or different PID with the main data stream, is ignored by the main MPEG decoder instead of being used for the decoding.

Meanwhile, the main data packet remover 709 removes 188-byte main data packet from the output of the derandomizer 708 and then outputs it to the E-VSB packet deformatter 710.

The E-VSB packet deformatter 710 removes 4-byte MPEG header and place holders for the known data inserted by the E-VSB packet formatter of the transmitting side, and then outputs it to the E-VSB data processor 711.

The E-VSB data processor 711 finally outputs enhanced data by performing a reverse process of the E-VSB pre-processor 101 of the transmitting side on an output of the E-VSB packet deformatter 710.

Accordingly, the present invention provides the following effects or advantages.

First of all, the present invention is strong against error in transmitting supplemental data via a channel. And, the present invention is compatible with a conventional VSB receiver. Moreover, the present invention enables an errorless reception of supplemental data on a channel having ghost and noise worse than those of the related art VSB system.

Secondly, the present invention transmits known data inserted in a specific place of a data area, thereby enhancing reception performance of a receiving system having considerable channel variations.

In particular, the present invention can move a parity place by performing non-systematic RS encoding on enhanced data packet including known data, thereby inserting a consecutively long known data sequence and raising a degree of freedom of an insertion place. In particular, it is possible to insert known data in a parity area of systematic RS encoding and to expand an area where initialization bytes can be inserted.

Finally, the present invention is effectively applicable to a portable or mobile receiver requiring robustness against noise with considerable channel variations.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A DTV transmitter for coding main and enhanced data for transmission, the DTV transmitter comprising:
   a pre-coder for pre-coding the enhanced data by coding the enhanced data for forward error correction (FEC);
   a data formatter for generating enhanced data packets including the pre-coded enhanced data;
   a first multiplexer for multiplexing the enhanced data packets with main data packets including the main data;
   an RS encoder for coding the multiplexed main data packets by a systematic coding scheme and the multiplexed enhanced data packets by a non-systematic coding scheme;

a data interleaver for interleaving the coded main and enhanced data packets; and a trellis encoder for trellis-encoding a 2-bit symbol of the interleaved data packets, a memory in the trellis encoder being initialized when the 2-bit symbol represents a beginning of a known data sequence.

2. The DTV transmitter of claim 1, wherein the memory in the trellis encoder is initialized such that an output from the trellis encoder has a known data pattern when an input to the trellis encoder has a known data pattern.

3. The DTV transmitter of claim 1, further comprising a backward-compatibility processor for generating new parity symbols based on an output of the RS encoder and providing the new parity symbols to the trellis encoder.

4. The DTV transmitter of claim 1, wherein a total number of the symbols representing the beginning of the known data sequence is 2.

5. The DTV transmitter of claim 1, wherein the main data packets contain audio and video (AV) MPEG data.

6. The DTV transmitter of claim 1, further comprising a second multiplexer for multiplexing an output of the trellis encoder with field and segment synchronization signals.

7. The DTV transmitter of claim 6, further comprising:
a pilot inserter for inserting pilot signals into an output signal of the second multiplexer;
a modulator for converting the signal having the pilot signals into an intermediate frequency (IF) signal; and
an RF converter for converting the IF signal into an RF signal for transmission.

8. The DTV transmitter of claim 1, wherein the pre-coder expands the FEC-coded enhanced data by inserting a plurality of null bits.

9. The DTV transmitter of claim 1, further comprising:
a convolutional encoder for encoding the enhanced data packets with a convolutional code;
a data deinterleaver for deinterleaving the enhanced data packets encoded with the convolutional code.

10. The DTV transmitter of claim 9, wherein the convolutional encoder converts the enhanced data packets into symbols.

11. A method of processing main and enhanced data for transmission in a DTV transmitter, the method comprising:
first RS-coding the enhanced data by coding the enhanced data for forward error correction (FEC);
generating enhanced data packets including the RS-coded enhanced data;
multiplexing the enhanced data packets with main data packets including the main data;
second RS-coding the multiplexed main data packets by a systematic RS-coding scheme and the multiplexed enhanced data packets systematic RS-coding scheme;
interleaving the second RS-coded main and enhanced data packets; and
trellis-encoding a 2-bit symbol of the interleaved main and enhanced data packets in a trellis encoder, wherein a memory in the trellis encoder is initialized when the 2-bit symbol is a beginning of a known data sequence.

12. The method of claim 11, wherein a total number of symbols representing the beginning of the known data sequence is 2.

13. The method of claim 11, wherein the main data packets contain audio and video (AV) MPEG data.

14. The method of claim 11, further comprising multiplexing an output signal of the trellis encoder with field and segment synchronization signals.

15. The method of claim 14, further comprising:
inserting pilot signals into the output signal of the trellis encoder having the synchronization signals;
converting the signal having the pilot signals into an intermediate frequency (IF) signal; and
converting the IF signal into an RF signal for transmission.

16. The method of claim 11, further comprising expanding the FEC-coded enhanced data by inserting a plurality of null bits into the FEC-coded enhanced data.

17. The method of claim 11, further comprising:
encoding the enhanced data packets with a convolutional code; and
deinterleaving the enhanced data packets encoded with the convolutional code.

18. A DTV receiver for processing coded main and enhanced data, the DTV receiver comprising:
a receiver receiving a signal, the signal generated in a transmitter by pre-coding the enhanced data for forward error correction (FEC), generating enhanced data packets including the pre-coded enhanced data, multiplexing the enhanced data packets with main data packets including the main data, RS-coding the multiplexed main data packets by a systematic RS-coding scheme and the multiplexed enhanced data packets by a non-systematic RS-coding scheme, interleaving the RS-coded main and enhanced data packets, and trellis-encoding the interleaved data packets by a trellis encoder, a memory in the trellis encoder being initialized when the interleaved data packets inputted into the trellis encoder are data packets representing a beginning of a known data sequence; and
a decoder decoding the received signal.

19. A method for processing main and enhanced data in a DTV receiver, the method comprising:
receiving a signal, the signal generated in a transmitter by pre-coding the enhanced data for forward error correction (FEC), generating enhanced data packets including the pre-coded enhanced data, multiplexing the enhanced data packets with main data packets including the main data, RS-coding the multiplexed main data packets by a systematic RS-coding scheme and the multiplexed enhanced data packets by a non-systematic RS-coding scheme, interleaving the RS-coded main and enhanced data packets, and trellis-encoding the interleaved data packets in a trellis encoder, a memory in the trellis encoder being initialized when the interleaved data packets inputted into the trellis encoder are data packets representing a beginning of a known data sequence; and
decoding the received signal.

20. A method for processing main and enhanced data for transmission in a DTV receiver, the method comprising:
receiving a signal, the signal generated in a transmitter by first RS-coding the enhanced by coding the enhanced data for forward error correction (FEC), generating enhanced data packets including the first RS-coded enhanced data, multiplexing the enhanced data packets with main data packets including the main data, second RS-coding the multiplexed main data packets by a systematic RS-coding scheme and the multiplexed enhanced data packets by a non-systematic RS-coding scheme, interleaving the second RS-coded main and enhanced data packets, and trellis-encoding a 2-bit symbol of the interleaved main and enhanced data packets in a trellis encoder, wherein a memory in the trellis encoder is initialized when the 2-bit symbol is a beginning of a known data sequence and two 2-bit symbols of the known data sequence are used for trellis initialization; and
decoding the received signal.

* * * * *